US012240988B2

(12) United States Patent
Ueda et al.

(10) Patent No.: US 12,240,988 B2
(45) Date of Patent: Mar. 4, 2025

(54) COATING COMPOSITION AND LAMINATE

(71) Applicant: DAIKIN INDUSTRIES, LTD., Osaka (JP)

(72) Inventors: Yuki Ueda, Osaka (JP); Shingo Okuno, Osaka (JP); Akiyoshi Yamauchi, Osaka (JP); Yoshihiro Souda, Osaka (JP); Yasukazu Nakatani, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/513,786

(22) Filed: Nov. 20, 2023

(65) Prior Publication Data
US 2024/0084158 A1 Mar. 14, 2024

Related U.S. Application Data

(63) Continuation of application No. PCT/JP2022/020428, filed on May 16, 2022.

(30) Foreign Application Priority Data

May 25, 2021 (JP) ................. 2021-087944

(51) Int. Cl.
*C09D 127/18* (2006.01)
*H05K 1/05* (2006.01)

(52) U.S. Cl.
CPC ........... *C09D 127/18* (2013.01); *H05K 1/056* (2013.01)

(58) Field of Classification Search
CPC .............................................. C08L 2205/025
See application file for complete search history.

(56) References Cited

U.S. PATENT DOCUMENTS

| | | | |
|---|---|---|---|
| 2005/0123739 A1 | 6/2005 | Chen-Yang et al. | |
| 2013/0211007 A1* | 8/2013 | Hayashi | C08L 27/12 525/200 |
| 2017/0099731 A1* | 4/2017 | Arisawa | C08J 5/244 |
| 2019/0144700 A1 | 5/2019 | Hosoda et al. | |
| 2019/0215957 A1 | 7/2019 | Kaimori et al. | |
| 2021/0345485 A1 | 11/2021 | Komori et al. | |

FOREIGN PATENT DOCUMENTS

| | | |
|---|---|---|
| CN | 106134296 A | 11/2016 |
| JP | 2014-223799 A | 12/2014 |
| JP | 2019-070081 A | 5/2019 |
| JP | 2019-183005 A | 10/2019 |
| JP | 2020-158720 A | 10/2020 |
| WO | 2018/016644 A1 | 1/2018 |
| WO | 2019/031071 A1 | 2/2019 |
| WO | 2020/145133 A1 | 7/2020 |

OTHER PUBLICATIONS

International Preliminary Report on Patentability issued Nov. 21, 2023 with a Translation of the Written Opinion of the International Searching Authority in Application No. PCT/JP2022/020428.
International Search Report for PCT/JP2022/020428 dated Aug. 2, 2022.
Extended European Search Report dated Jun. 18, 2024 in Application No. 22811195.1.

* cited by examiner

*Primary Examiner* — Ian A Rummel
(74) *Attorney, Agent, or Firm* — Sughrue Mion, PLLC

(57) ABSTRACT

Provided is an aqueous coating composition capable of forming a fluororesin coating film layer with excellent electrical properties and surface physical properties, and good adhesive properties. A coating composition containing 2 or more kinds of fluororesins, where at least 1 kind of the fluororesin, a fluororesin (I), has a number of functional groups of 30 to 1,000 per $10^6$ main-chain carbon atoms, and where the coating composition further contains an inorganic filler, a surfactant, and a liquid medium.

14 Claims, No Drawings

COATING COMPOSITION AND LAMINATE

CROSS REFERENCE TO RELATED APPLICATIONS

This application is a Rule 53(b) Continuation of International Application No. PCT/JP2022/020428 filed May 16, 2022, which claims priority from Japanese patent application No. 2021-087944 filed May 25, 2021, the respective disclosures of all of which are incorporated herein by reference in their entireties.

TECHNICAL FIELD

The present disclosure relates to a coating composition and a laminate.

BACKGROUND ART

One of the known intended uses of a coating composition containing a fluororesin is the electronic materials field. Such a composition is also considered as a printed circuit board material particularly for frequencies in the high frequency band (Patent Literatures 1 to 3).

Patent Literature 4 discloses a fluororesin composition having a specific proportion of a carbonyl group-containing functional group as the fluororesin and having silica for improving adhesion and coefficient of linear expansion.

CITATION LIST

Patent Literature

Patent Literature 1: Japanese Patent Laid-Open No. 2019-183005
Patent Literature 2: International Publication No. WO 2018/016644
Patent Literature 3: International Publication No. WO 2019/031071
Patent Literature 4: International Publication No. WO 2020/145133

SUMMARY

The present disclosure relates to a coating composition containing 2 or more kinds of fluororesins,
 wherein at least 1 kind of the fluororesin, a fluororesin (I), has a number of functional groups of 30 to 1,000 per $10^6$ main-chain carbon atoms,
 wherein the coating composition further contains an inorganic filler, a surfactant, and a liquid medium.

Advantageous Effects

The present disclosure enables to obtain the coating composition capable of forming a fluororesin coating film layer with excellent electrical properties and surface physical properties, and good adhesive properties.

DESCRIPTION OF EMBODIMENTS

Fluororesins are known to have various uses in various use forms such as powders and films utilizing excellent heat resistance, weather resistance, oil resistance, solvent resistance, chemical resistance, and non-stickiness thereof.

Further, a laminate on which a fluororesin insulating layer is formed has also been dominantly used for printed wiring boards, which are used in a high frequency range of a tens of gigahertz level, from the viewpoint of dielectric characteristics and hygroscopicity.

However, fluororesins, which exhibit high non-stickiness, sometimes had insufficient adhesive properties between a coating film layer of a fluororesin and a substrate. Particularly, development of a fluororesin coating composition with enhanced adhesive properties has been demanded so that the coating film layer can be sufficiently adhered to a metal substrate such as a copper foil. In recent years, the use of a smooth copper foil having a small surface roughness has been studied to enhance performance, whereby further improvement in adhesive properties is increasingly required.

Additionally, a printed wiring board needs to be heated at a high temperature in working process for soldering. For this reason, a resin must have excellent heat resistance. Thus, it is essential that the resin has all of the performance such as heat resistance, film formability, and adhesive properties.

In consideration of the above, the present disclosure found that good adhesive properties can be imparted, and good performance in heat resistance can also be obtained when 2 or more kinds of fluororesins are contained in the coating composition and at least 1 kind of the fluororesin has the number of functional groups of 30 to 1,000 per $10^6$ main-chain carbon atoms.

Hereinafter, the present disclosure will be described in detail.

The coating composition of the present disclosure contains 2 or more kinds of fluororesins, and at least 1 kind of the fluororesin has functional groups. Further in the fluororesin having functional groups, it is essential that the number of functional groups is 30 to 1,000 per $10^6$ main-chain carbon atoms (hereinafter, referred to as fluororesin (I)). It should be noted that the functional group used herein means a functional group that causes interaction with the surface of an adherend and contributes to enhancement in adhesive properties. Specifically, it is preferable that the functional groups are those shown in Table 1 below.

The coating composition of the present disclosure contains the above fluororesin (I) and another fluororesin (hereinafter, referred to as fluororesin (II)) in combination.

The fluororesin (II) is not limited, and it is preferable that the number of functional groups is less than 30 per $10^6$ main-chain carbon atoms. Namely, it is preferable that the fluororesin (II) is different from the fluororesin (I) in terms of the number of functional groups.

The lower limit in the number of functional groups is preferably 50 groups, and further preferably 100 groups. The upper limit in the number of functional groups is more preferably 700 groups, and further preferably 500 groups.

Infrared spectroscopy can be used to identify the kind of functional groups and measure the number of functional groups.

The number of functional groups can be analyzed from an aqueous dispersion of a single fluororesin but can also be analyzed by isolating a fluororesin of interest from a coating material.

The number of functional groups is specifically measured by the following method. First, a tablet is prepared using a fluororesin powder and KBr, and this tablet is analyzed by Fourier-transform infrared spectroscopy to obtain an infrared absorption spectrum of the fluororesin, whereby a difference spectrum from the base spectrum, in which functional groups are completely fluorinated and absent, is obtained. Using the absorption peak of a specific functional group appeared in this difference spectrum, the number of functional groups N per 1×10⁶ main-chain carbon atoms in the fluororesin is calculated in accordance with the following formula (A).

$$N = I \times K / t \quad (A)$$

I: Absorbance
K: Correction coefficient
t: Film thickness (mm)

For reference, absorption frequency, molar absorption coefficient, and correction coefficient of the functional groups in the present disclosure are shown in Table 1. The molar absorption coefficients are determined based on FT-IR measurement data of low molecular weight model compounds.

TABLE 1

| Functional group | Absorption frequency ($CM^{-1}$) | Molar absorption coefficient (l/cm/mol) | Correction coefficient | Model compound |
|---|---|---|---|---|
| —COF | 1883 | 600 | 388 | $C_7F_{15}COF$ |
| —COOH free | 1815 | 530 | 439 | $H(CF_2)_6COOH$ |
| —COOH bonded | 1779 | 530 | 439 | $H(CF_2)_6COOH$ |
| —COOCH₃ | 1795 | 680 | 342 | $C_7F_{15}COOCH_3$ |
| —CONH₂ | 3436 | 506 | 460 | $C_7H_{15}CONH_2$ |
| —CH₂OH₂, —OH | 3648 | 104 | 2236 | $C_7H_{15}CH_2OH$ |
| —CF₂H | 3020 | 8.8 | 26485 | $H(CF_2CF_2)_3CH_2OH$ |
| —CF=CF₂ | 1795 | 635 | 366 | $CF_2=CF_2$ |

It should be noted that the absorption frequencies of —CH₂CF₂H, —CH₂COF, —CH₂COOH, —CH₂COOCH₃, and —CH₂CONH₂ are lower in several tens of kayser (cm⁻¹) than the absorption frequencies of —CF₂H, —COF, —COOH free and —COOH bonded, —COOCH₃, and —CONH₂ shown respectively in the table.

Accordingly, for example, the number of functional groups of —COF is the total of the number of functional groups determined from the absorption peak of absorption frequency 1883 cm⁻¹ caused by —CF₂COF and the number of functional groups determined from the absorption peak of absorption frequency 1840 cm⁻¹ caused by —CH₂COF.

The functional group refers to functional groups present at an end of the main chain or an end of a side chain of the fluororesin (I), and functional groups present in the main chain or a side chain. In the present disclosure, it is preferable that the functional group is present at an end of the polymer main chain. A functional group present at a polymer end can efficiently enhance adhesive properties.

The number of functional groups may be the total number of —CF=CF₂, —CF₂H, —COF, —COOH, —COOCH₃, —CONH₂, and —CH₂OH.

In the present disclosure, it is preferable that the functional group is carbonyl group-containing groups, and of these it is more preferable that the functional group is at least 1 group selected from the group consisting of carbonyl amide group, carboxy group, acyl fluoride group, and methoxycarbonyl group. Carboxy group and carbonyl amide group are particularly preferable from the viewpoint of imparting adhesive properties.

The functional group is introduced to a fluororesin by, for example, a chain transfer agent or a polymerization initiator used for producing the fluororesin. For example, when alcohol is used as the chain transfer agent, or a peroxide having the —CH₂OH structure is used as the polymerization initiator, —CH₂OH is introduced to an end of the main chain of a fluororesin. Alternatively, the fluororesin to which the functional group is introduced by polymerizing monomers having a functional group (for example, acid anhydrides of unsaturated dicarboxylic acids such as itaconic anhydride, citraconic anhydride, nadic anhydride, and maleic anhydride) may also be acceptable.

The functional groups are preferably introduced to an end of a fluororesin by a chain transfer agent or a polymerization initiator used for producing the fluororesin. Such a structure is preferable in terms of achieving better adhesive properties.

The functional groups, which are introduced to an end of a fluororesin by a chain transfer agent or a polymerization initiator used for producing the fluororesin, may further be reacted to convert to other structures. There is also a method of generating a functional group at an end of the main chain by subjecting a powder of fluororesin to corona treatment.

It is preferable that the fluororesin (I) has a melting point of 190 to 350° C. The melting point is more preferably 200° C. or more, further preferably 220° C. or more, particularly preferably 280° C. or more, and more preferably 330° C. or less. The melting point refers to the temperature corresponding to the local maximum value of the heat-of-fusion curve at a temperature increase rate of 10° C./min using a differential scanning calorimeter [DSC].

It is preferable that the fluororesin (I) is a fluororesin, which has flowability when melting and is melt-processable. Further, it is more preferable from the viewpoint of obtaining excellent electrical characteristics that the fluororesin (I) is at least 1 kind of copolymer selected from the group consisting of a copolymer containing a tetrafluoroethylene unit (TFE unit) and a fluoroalkyl allyl ether or a (per)fluoro (alkyl vinyl ether) unit (PAVE unit) (hereinafter, referred to as TFE/fluoroalkyl allyl ether or PAVE copolymer (or PFA)), and a copolymer containing a TFE unit and a hexafluoropropylene unit (HFP unit) (hereinafter, referred to as TFE/HFP copolymer (or FEP)). Of these, it is particularly preferable to contain the TFE/HFP copolymer (FEP) from the viewpoint of imparting more excellent adhesive properties.

The fluororesin (I) may also use 2 or more kinds of fluororesins in combination.

(Per)fluoro(alkyl vinyl ether) (PAVE) may be fluoroalkyl vinyl ether, or may also be perfluoro(alkyl vinyl ether). In the present disclosure, the "perfluoro(alkyl vinyl ether)" refers to alkyl vinyl ether that does not contain a C—H bond.

PAVE structuring the PAVE unit can be at least 1 kind selected from the group consisting of a monomer represented by Formula (1):

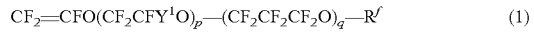

wherein Y¹ represents F or CF₃, R^f represents a perfluoroalkyl group having 1 to 5 carbon atoms. p represents an integer of 0 to 5, and q represents an integer of 0 to 5), and a monomer represented by Formula (2):

$$CFX{=}CXOCF_2OR^1 \quad (2)$$

wherein X, same or different, represents H, F or $CF_3$, $R^1$ is a linear or branched fluoroalkyl group having 1 to 6 carbon atoms and may contain 1 to 2 atoms of at least 1 kind selected from the group consisting of H, Cl, Br and I, or a cyclic fluoroalkyl group having 5 or 6 carbon atoms and may contain 1 to 2 atoms of at least 1 kind selected from the group consisting of H, Cl, Br and I.

Of these, the PAVE is preferably the monomer represented by Formula (1), more preferably at least 1 kind selected from the group consisting of perfluoro(methyl vinyl ether), perfluoro(ethyl vinyl ether) and perfluoro(propyl vinyl ether) (PPVE), and further preferably PPVE.

The content of the PAVE unit in the TFE/PAVE copolymer with respect to all the monomer units is preferably 1.0 to 10% by mass, more preferably 2.0% by mass or more, further preferably 3.5% by mass or more, particularly preferably 4.0% by mass or more, most preferably 5.0% by mass or more, and more preferably 8.0% by mass or less, further preferably 7.0% by mass or less, particularly preferably 6.5% by mass or less, and most preferably 6.0% by mass or less. An amount of the PAVE unit is measured by the $^{19}$F-NMR method. The TFE/PAVE copolymer may be a copolymer consisting only of the TFE unit and the PAVE unit.

When the fluoropolymer (I) is the TFE/PAVE copolymer, the melting point is preferably 280 to 322° C., more preferably 290° C. or more, and more preferably 315° C. or less.

When the fluoropolymer (I) is the TFE/PAVE copolymer, glass transition temperature (Tg) is preferably 70 to 110° C., more preferably 80° C. or more, and more preferably 100° C. or less. The glass transition temperature is the value obtained by measuring dynamic viscoelasticity.

The TFE/HFP copolymer contains the TFE unit and the HFP unit. The content of the TFE unit in the TFE/HFP copolymer with respect to all the monomer units is preferably 70% by mass or more, more preferably 85% by mass or more, and preferably 99.8% by mass or less, more preferably 99% by mass or less, and further preferably 98% by mass or less.

It is preferable that the TFE/HFP copolymer has a mass ratio of the TFE unit to the HFP unit (TFE/HFP) of 70 to 99/1 to 30 (% by mass). The mass ratio (TFE/HFP) is more preferably 85 to 95/5 to 15 (% by mass).

The TFE/HFP copolymer can further contain a (per)fluoro (alkyl vinyl ether) (PAVE) unit. Examples of the PAVE unit contained in the TFE/HFP copolymer include the same PAVE units as described above. The TFE/PAVE copolymer described above does not contain the HFP unit and thus is different from the TFE/HFP/PAVE copolymer in that respect.

When the TFE/HFP copolymer is a copolymer containing the TFE unit, HFP unit, and PAVE unit (hereinafter, also referred to as "TFE/HFP/PAVE copolymer"), the mass ratio (TFE/HFP/PAVE) is preferably 70 to 99.8/0.1 to 25/0.1 to 25 (% by mass). The mass ratio (TFE/HFP/PAVE) is more preferably 75 to 98/1.0 to 15/1.0 to 10 (% by mass). It is preferable that the TFE/HFP/PAVE copolymer contains 1% by mass or more of the HFP unit and the PAVE unit in total with respect to all the monomer units.

The TFE/HFP/PAVE copolymer preferably contains 25% by mass or less of the HFP unit of all the monomer units. The content of the HFP unit is more preferably 20% by mass or less, further preferably 18% by mass or less, and particularly preferably 15% by mass or less. The content of the HFP unit is preferably 0.1% by mass or more, more preferably 1% by mass or more, and particularly preferably 2% by mass or more. The content of the HFP unit can be measured by the $^{19}$F-NMR method.

The content of the PAVE unit is more preferably 20% by mass or less, and further preferably 10% by mass or less, and particularly preferably 3% by mass or less. The content of the PAVE unit is preferably 0.1% by mass or more, and more preferably 1% by mass or more. The content of the PAVE unit can be measured by the $^{19}$F-NMR method.

The TFE/PAVE copolymer and the TFE/HFP copolymer may further contain another ethylene monomer (α) unit. The another ethylene monomer (α) unit is not limited as long as it is a monomer unit copolymerizable with TFE, HFP and PAVE, and examples include fluorine-containing ethylene monomers such as vinyl fluoride (VF), vinylidene fluoride (VdF), trifluoroethylene (TrFE), and chlorotrifluoroethylene (CTFE), and non-fluorinated ethylene monomers such as ethylene, propylene and alkyl vinyl ether. The content of the another ethylene monomer (α) unit is preferably 0 to 25% by mass, and more preferably 0.1 to 25% by mass.

When the copolymer is a TFE/HFP/PAVE/another ethylene monomer (α) copolymer, the mass ratio (TFE/HFP/PAVE/another ethylene monomer (α)) is preferably 70 to 98/0.1 to 25/0.1 to 25/0.1 to 25 (% by mass). It is preferable that the TFE/HFP/PAVE/another ethylene monomer (α) copolymer contains 1% by mass or more of monomer units other than the TFE unit in total.

The melting point of the TFE/HFP copolymer is preferably 200 to 322° C., more preferably more than 200° C., and further preferably 220° C. or more, and more preferably 300° C. or less, and further preferably 280° C. or less.

The glass transition temperature (Tg) of the TFE/HFP copolymer is preferably 60 to 110° C., more preferably 65° C. or more, and more preferably 100° or less. The glass transition temperature is the value obtained by measuring dynamic viscoelasticity.

The fluororesin (I) can be produced by a conventionally known method of, for example, suitably mixing monomers to be constituent units of the resin and additives such as a polymerization initiator, and performing emulsion polymerization and suspension polymerization. Of these, the fluororesin (I) obtained by the emulsion polymerization is more preferable.

It is preferable that the fluororesin (I) has a value of MFR within a range from 0.5 to 100 when measured at 372° C. with a load of 5 kg. Such a range is preferable in terms of easily obtaining the above-mentioned amount of functional groups by end functional groups.

The coating composition of the present disclosure contains the fluororesin (I) and another fluororesin (II) in combination.

The fluororesin (II) is not limited and preferably has the number of functional groups of less than 30 per $10^6$ main-chain carbon atoms. Namely, it is preferable that the fluororesin (II) is different from the fluororesin (I) in terms of the number of functional groups.

A fluororesin with a large number of functional groups exhibits excellent performance in the respect of adhesion but is likely to have insufficient electrical characteristics and heat resistance. For this reason, it is preferable to use a fluororesin with excellent electrical characteristics and heat resistance as the fluororesin (II) in combination. By doing this, a coating film layer with excellent coating film properties such as electrical characteristics and heat resistance can be formed.

The fluororesin (II) is not limited as long as it is a fluorine-containing resin, and examples include polytetrafluoroethylene resin (PTFE), PFA, and FEP. Of these, PTFE is particularly preferable. PTFE is further preferable because the TFE homopolymer has soft particles that easily stick, thereby less likely causing cracks. The index of softness is not limited but preferably a shore hardness (D scale) of D65 or less, more preferably D60 or less, and particularly preferably D55 or less. It is preferable to use PFA and FEP that have the same resin compositions as the fluororesin (I) described above, and have the different number of functional groups from that of the fluororesin (I).

The polymerization method of the fluororesin (II) is not limited, and examples include bulk polymerization, suspension polymerization, solution polymerization, and emulsion polymerization. In the above polymerizations, various conditions such as temperature and pressure, a polymerization initiator and other additives can be suitably set in accordance with compositions and amounts of a desired fluororesin.

The fluororesin (II) may be subjected to fluorination treatment thereby to prepare the fluororesin having the number of functional groups within the above range.

The fluorination treatment can be carried out by allowing a fluororesin that is not fluorination treated to contact a fluorine-containing compound.

The fluorine-containing compound is not limited, and examples include a fluorine radical source that generates fluorine radical under fluorination treatment conditions. Examples of the fluorine radical source include a $F_2$ gas, $CoF_3$, $AgF_2$, $UF_6$, $OF_2$, $N_2F_2$, $CF_3OF$, and halogen fluoride (for example, $IF_5$, $ClF_3$).

The fluorine radical source such as a $F_2$ gas may have a 100% concentration, but is preferably used, considering handleability, as diluted to 5 to 50% by mass by mixing with an inert gas, and more preferably used as diluted to 15 to 30% by mass. Examples of the inert gas include nitrogen gas, helium gas, and argon gas, but nitrogen gas is economically preferable.

The fluorination treatment conditions are not limited, and a fluororesin in the molten state may be allowed to contact a fluorine-containing compound but the fluorination treatment can be typically carried out at a melting point or less of a fluororesin, preferably at a temperature of 20 to 220° C., and more preferably at a temperature of 100 to 200° C. The fluorination treatment is generally carried out for 1 to 30 hours, and preferably 5 to 25 hours. It is preferable that the fluorination treatment allows a fluororesin that is not fluorination treated to contact a fluorine gas ($F_2$ gas).

The mixing ratio (mass ratio) of the fluororesin (I) to the fluororesin (II) is preferably fluororesin (I):fluororesin (II) =90:10 to 10:90. It is more preferably 80:20 to 20:80, and further preferably 70:30 to 30:70. When an amount of the fluororesin (I) contained is small, adhesive properties may be insufficient. When an amount of the fluororesin (II) contained is small, electrical characteristics and heat resistance may deteriorate, hence not preferable.

It is preferable that the fluororesins in the coating composition of the present disclosure are present in a particle state in the coating composition. In this case, the average particle size of the fluororesin particles is preferably less than 0.3 μm. The average particle size herein is not limited to the fluororesin (I) or the fluororesin (II) but is the value obtained by measuring particles randomly selected from the fluororesin particles contained in the coating composition and calculating.

Specifically, the average particle size is the value obtained by diluting the coating composition 1,000-fold with water, placing a drop of the diluted liquid on an aluminum foil to dry by itself, taking an SEM (scanning electron microscope) image thereof, measuring particle sizes from image data of 50 particles randomly selected using an SEM image analysis software, and calculating an average.

The average particle size has the lower limit of preferably 0.05 μm, more preferably 0.07 μm, and further preferably 0.1 μm.

The coating composition of the present disclosure further contains an inorganic filler for enhancing electrical characteristics, strength, heat resistance and the like. The inorganic filler is not limited, and examples include inorganic compounds such as silicas (more specifically, crystalline silica, fused silica, and spherical fused silica, and the like), titanium oxide, zirconium oxide, zinc oxide, tin oxide, silicon nitride, silicon carbide, boron nitride, calcium carbonate, calcium silicate, potassium titanate, aluminum nitride, indium oxide, alumina, antimony oxide, cerium oxide, magnesium oxide, iron oxide, and tin-doped indium oxide (ITO). Additionally, examples include minerals such as montmorillonite, talc, mica, boehmite, kaolin, smectite, xonotlite, vermiculite, and sericite. Examples of other fillers include carbon compounds such as carbon black, acetylene black, Ketjen black, and carbon nanotube; metal hydroxides such as aluminum hydroxide, and magnesium hydroxide; various glasses such as glass bead, glass flake, and glass balloon.

For the above inorganic fillers, one or two or more kinds of inorganic fillers can be used.

Additionally, inorganic fillers may directly be used as a powder or may be used as dispersed in the resin.

Silica, alumina, titanium oxide, boron nitride, talc, and the like are preferable as the inorganic filler, with silica having a specific gravity close to that of the fluororesins and low dielectric constant being particularly preferable. When the coating composition contains a silica, thermal expansion coefficient of the coating film can be kept low. Additionally, this action can prevent the board from warpage, hence preferable. Further, the peel strength of the coating film layer can also be enhanced.

The inorganic filler preferably has a specific surface area of less than 6.5 $m^2$/g, and more preferably less than 6.3 $m^2$/g by, for example, by the BET method. Further, it is preferable to be larger than 1 $m^2$/g. When a specific surface area is within the above range, there is little aggregation of an inorganic filler in the film resulting in the smooth coating film surface, hence preferable.

The inorganic filler has an average particle size of preferably 0.1 to 20 μm. When an average particle size is within the above range, good surface roughness with little aggregation can be achieved. The lower limit of the average particle size is more preferably 0.3 μm. The upper limit of the average particle size is more preferably 5 μm, and further preferably 2 μm. The average particle size is the value measured by the laser diffraction scattering method.

The inorganic filler has the maximum particle size of preferably 10 μm or less. When a maximum particle size is 10 μm or less, there is little aggregation and a dispersion state is good. Further, the surface roughness of the obtained coating film can be small. The maximum particle size is more preferably 5 μm or less. A maximum particle size is determined by taking an SEM (scanning electron microscope) image and using image data of 200 particles randomly selected using an SEM image analysis software.

The shape of an inorganic filler is not limited, and spherical shape, columnar shape, conical shape, frustum shape, polyhedron shape, hollow shape, and the like can be used. It is particularly preferable to be spherical shape, cube shape, bowl shape, disc shape, octahedral shape, scaly shape, bar shape, plate shape, rod shape, tetrapod shape, or hollow shape, with spherical shape, cube shape, octahedral shape, plate shape, and hollow shape being more preferable.

When 70% by mass of an inorganic filler is mixed with 30% by mass of water, it is preferable that the inorganic filler is capable of homogeneously dispersed. The homogeneous dispersion means that the dispersion, when allowed to stand, does not cause a deposit even in a state where a flow is absent. When the dispersion is insufficient, the stability of the coating composition may deteriorate.

The inorganic filler may be subjected to surface treatment, and may also be subjected to, for example, surface treatment with a silicone compound. The inorganic filler surface-treated with a silicone compound enables dielectric constant of the inorganic filler to be lower.

The silicone compound is not limited and a conventionally known silicone compound can be used. For example, it is preferable to contain at least one kind selected from the group consisting of silane coupling agents and organosilazane.

The surface treatment amount of the silicone compound is preferably 0.1 to 10 particles, and more preferably 0.3 to 7 particles, per unit surface area ($nm^2$), in terms of the reacting amount of the surface-treating agent onto the silica particle surface.

For the above inorganic filler, one kind, or two or more kinds with different physical properties can be used.

Additionally, inorganic fillers may directly be used as a powder or may be used as dispersed in the resin.

In the coating composition of the present disclosure, it is preferable to be the total amount of the fluororesins:inorganic filler=10:90 to 90:10 (mass ratio). When the fluororesins and the inorganic filler are contained in such a proportion, the effect of preventing the warpage can be obtained. The above amount to be contained has the lower limit in the amount of the fluororesins to be contained of more preferably 10, and further preferably 20. The above amount to be contained has the upper limit in the amount of the fluororesins to be contained of more preferably 90, and further preferably 80. The above amount to be contained has the upper limit in the amount of the inorganic filler to be contained of more preferably 60, and further preferably 50.

The coating composition of the present disclosure further contains a surfactant. The surfactant is not limited, and a known surfactant can be used but it is preferable to use a non-fluorosurfactant. Non-fluorosurfactants are more preferable than fluorosurfactants in the aspect of cost. Further, when a fluorosurfactant is contained, hydrofluoric acid is generated when sintering the above fluororesins. This hydrofluoric acid promotes the deterioration of silica particles, whereby it is preferable not to contain such a surfactant.

The non-fluorosurfactant is not limited as long as it can stably disperse the fluororesins in the composition, and any of anionic surfactants, cationic surfactants, nonionic surfactants, and amphoteric surfactants can be used. Examples include anionic surfactants such as sodium alkylsulfate, sodium alkyl ether sulfate, triethanolamine alkyl sulfate, triethanolamine alkyl ether sulfate, ammonium alkyl sulfate, ammonium alkyl ether sulfate, sodium alkyl ether phosphate, and sodium fluoroalkyl carboxylate; cationic surfactants such as alkylammonium salt, and alkyl benzyl ammonium salt; nonionic surfactants such as polyoxyethylene alkyl ether, polyoxyethylene phenyl ether, polyoxyethylene alkyl ester, propylene glycol-propylene oxide copolymer, perfluoroalkyl ethylene oxide adduct, and 2-ethylhexanol ethylene oxide adduct; and amphoteric surfactants such as alkyl amino acetic acid betaine, alkyl amide acetic acid betaine, and imidazolinium betaine. Of these, anionic and nonionic surfactants are preferable. The surfactant particularly preferable is nonionic surfactants that have an oxyethylene chain with a small pyrolysis residue.

Examples of commercial product of the above nonionic surfactants include Genapol X080 (product name, manufactured by Clariant AG), NOIGEN TDS series (manufactured by DKS Co. Ltd.) as represented by NOIGEN TDS-80 (product name) and NOIGEN TDS-100 (product name), LEOCOL TD series (manufactured by Lion Corporation) represented by LEOCOL TD-90 (product name), LIONOL (registered trademark) TD series (manufactured by Lion Corporation), T-Det A series (manufactured by Harcros Chemicals Inc.) represented by T-Det A138 (product name), TERGITOL (registered trademark) 15S series (manufactured by Dow Inc.), and DISPANOL TOC (product name, manufactured by NOF CORPORATION).

For the above non-fluorosurfactant, hydrocarbon-based surfactants, silicone-based surfactants, and acetylene-based surfactants such as acetylene glycol can also be used. Of these non-fluorosurfactants, one kind may be used, or two or more kinds may be used in combination. It should be noted that nonylphenol-based surfactants are preferably not used.

The amount of the non-fluorosurfactant to be contained with respect to 100% by mass of the total amount of the fluororesins is preferably 0.01 to 50% by mass, more preferably 0.1 to 30% by mass, and further preferably 0.2 to 20% by mass. When an amount of the surfactant added is too small, the fluororesins are not homogeneously dispersed whereby partial floating may be caused. On the other hand, when an amount of the surfactant added is too large, the decomposition residue of the surfactant by sintering increases and thus causes coloring, and additionally heat resistance, non-stickiness, and the like of the coating film deteriorate.

A thickener may optionally be added. The thickener is not limited as long as it thickens a coating material and does not affect coating film properties, but a nonionic emulsion of higher fatty acids is preferable because it forms a three-dimensional network structure with fluororesin particles, enhances the apparent viscosity, and prevents the coating film from cracking. Oleic acid emulsions and octanoic acid emulsions are particularly preferable.

The coating composition of the present disclosure further contains a liquid medium. The liquid medium is not limited but preferably contains water.

Further, the coating composition of the present disclosure preferably contains a water-soluble solvent in combination with water. The water-soluble solvent works to wet the fluororesins, and those with a high boiling point connect the resins when dried after application, and acts as a drying retarder for preventing cracks from being caused. A high boiling point solvent evaporates at a sintering temperature of the fluororesins and thus does not affect the coating film.

Specific examples of the water-soluble solvent include low boiling point organic solvents having a low boiling point of up to 100° C. such as methanol, ethanol, isopropanol, sec-butanol, t-butanol, acetone, and methyl ethyl ketone; medium boiling point organic solvents having a boiling point of 100 to 150° C. such as methyl cellosolve, and ethyl cellosolve; high boiling point organic solvents having a high boiling point of 150° C. or more such as N-methyl-2-pyrrolidone, N,N-dimethylacetamide, 3-butoxy-N,N-dimethylpropanamide, 3-butoxy-N,N-dimethylpropanamide, N,N-dimethylformamide, ethylene glycol, propylene glycol, glycerol, dimethyl carbitol, butyl carbitol, butyl dicarbitol, butyl cellosolve, 1,4-butanediol, diethylene glycol, triethylene glycol, tetraethylene glycol, and diethylene glycol monomethyl ether. These water-soluble solvents may be used in 1 kind, or 2 or more kinds may be used in mixture. For the water-soluble solvent, high boiling point organic solvents are preferable, of which glycol-based solvents are more preferable in the respect of dispersion stability.

It is preferable that the glycol-based solvent contains at least 1 kind selected from the group consisting of ethylene glycol, diethylene glycol monomethyl ether, glycerol, and butyl carbitol.

The amount of the water-soluble solvent to be contained is preferably 0.5 to 50% by mass, and more preferably 1 to 30% by mass, of the total amount of water. In the case of a low boiling point organic solvent, when an amount contained is too small, air bubble entrainment is likely to be caused, whereas such an amount is too large, the whole composition is caused to be flammable, thereby losing the benefit of being an aqueous dispersion composition. In the case of a medium boiling point organic solvent, when an amount contained is too large, the solvent may remain in and thereby affect the coating film even after sintering, whereas such an amount is too small, the fluororesins are re-powderized when dried after application and cannot be sintered. In the case of a high boiling point organic solvent, when an amount contained is too large, the solvent may remain in and thereby affect the coating film even after sintering. It is preferable that the above water-soluble solvent does not remain in the coating film even after the fluororesins are sintered by selecting an easily volatile solvent, or adjusting an amount to be contained. The glycol-based solvent, which does not remain in the coating film after the fluororesins are sintered, can be confirmed when the sintered coating film is scraped off and no weight reduction is found near the boiling point of the glycol-based solvent when measured by TG/DTA.

The coating composition can contain various additive typically added to fluororesin compositions such as a stabilizer, a thickener, a decomposition promoter, a corrosion inhibitor, a preservative, and an antifoaming agent.

One of the present disclosures is a laminate having a coating film layer formed by applying the above coating composition.

The coating composition can be applied by an application method used for typical coating materials, and examples of the application method include spray coating, roll coating, doctor blade coating, dip (immersion) coating, impregnation coating, spin-flow coating, curtain flow coating, bar coater coating, gravure coating method, MICROGRAVURE coating method, and die coating.

The coating composition, after the above application, is dried and sintered, thereby forming the laminate of the present disclosure. The drying is not limited as long as it is a method capable of removing a liquid medium, and examples include a method of drying, by optionally heating, at room temperature to 130° C. for 5 to 30 minutes. The sintering is carried out at a temperature or more of the melting points of the fluororesins, and it is preferable to carry out in the range typically from 200 to 400° C. for 10 to 60 minutes. It is preferable that the drying and sintering are carried out under inert gas to prevent the coated metal foil from oxidizing.

The coating film formed by using the coating composition of the present disclosure preferably has a thickness of 2 to 40 μm after dried and sintered. A coating film within such a range can easily form a good coating film that does not cause any issue of coating film conditions, and further sufficiently demonstrates physical properties required as the coating film. The lower limit is more preferably 3 μm, and further preferably 5 μm. The upper limit is more preferably 35 μm, and further preferably 30 μm.

The usable substrate in the laminate of the present disclosure include metals such as iron, stainless steel, copper, aluminum, and brass; glass products such as glass plate, and woven and non-woven fabrics made of glass fiber; formed articles and coated object made of common and heat resistance resins such as polypropylene, polyoxymethylene, polyimide, modified polyimide, polyamidimide, polysulfone, polyether sulfone, polyether ether ketone, and liquid crystal polymer; formed articles and coated object made of common rubbers such as SBR, butyl rubber, NBR, and EPDM, and made of heat resistant rubber such as silicone rubber, and fluoroelastomer; and woven and non-woven fabrics made of natural fiber and synthetic fiber; and laminated substrates formed by combinations thereof.

The above substrates may be surface processed. Examples of the surface process include roughening the surface to a desired degree of roughness using a sandblaster, roughening the surface by adhering particles thereto, and treating the surface for preventing metal oxidation.

The coating composition of the present disclosure can enhance adhesive properties to the substrate. Specifically, the adhesion strength between the coating film layer formed by applying the coating composition of the present disclosure and the substrate can be 5 N/cm or more.

The adhesion strength is the value obtained by superposing the laminate consisting of the coating film layer and the substrate so that the coating film layer adheres firmly to a copper foil, pressing for 5 minutes at a heating temperature under vacuum: 320° C. and a pressure: 3 MPa, thereby obtaining a bonded body on which the laminate consisting of the coating film layer and the substrate and the copper foil are laminated, and then cutting the bonded body to strip shape of width 10 mm×length 40 mm×3 sets to prepare test pieces, subjecting these test pieces to a 90-degree peel test using an autograph (manufactured by SHIMADZU CORPORATION, AGS-J 5 kN) in conformity with JIS C 6481-1996, at 25° C. and a tensile speed of 50 ram/min, observing and measuring a delamination mode.

The above adhesion strength is more preferably 7 N/cm or more.

The adhesion strength varies depending on the kind of substrate even when the coating composition used is the same, but the coating composition of the present disclosure is particularly preferable in the respect of obtaining excellent peel strength as described above even when a substrate, which is typically difficult to obtain a peel strength, is used.

More specifically, even when the substrate is a metal substrate having a small surface roughness, an adhesion strength in the range described above can be obtained. For example, when a copper foil having a surface roughness (Rz) of 1.0 μm or less is used as the substrate, the conventional fluorine-containing coating composition failed to obtain sufficient adhesive properties, but the coating film layer made of the coating composition of the present disclosure can demonstrate an adhesion strength of 5 N/cm or more.

The surface roughness (Rz) refers to ten-point average roughness stipulated in JIS-B0601. In the present description, the above Rz is the value measured by using a surface texture and contour measuring instrument (product name: SURFCOM 470A, manufactured by TOKYO SEIKI KOSAKUSHO Co., Ltd) with a measurement length of 4 mm.

The laminate of the present disclosure can be used in the fields in which heat resistance, solvent resistance, lubricity, non-stickiness, and the like are required, and used for films, fiber reinforced films, prepregs, resin coated metal foils, metal-clad laminates, printed circuit boards, dielectric materials for circuit boards, laminated circuit boards, and the like.

It is particularly preferable that the laminate of the present disclosure has the coating film layer formed by the coating composition of the present disclosure on a copper foil. In recent years, communications in high frequency ranges have been increasing in various fields. For the reduction of a transmission loss when used in high frequency ranges, a laminate in which a fluoropolymer-containing dielectric layer and a copper foil are laminated has been used. The coating composition of the present disclosure can be used particularly preferably in such a usage.

EXAMPLES

Hereinafter, the present invention will be described with reference to examples. In the examples, % and part in the containing proportion mean % by mass and parts by mass unless otherwise specified. The present invention is not limited to the examples described below.

Preparation of FEP-1 Aqueous Dispersion

An aqueous dispersion containing 30% of FEP (TFE/HFP=84/16 mass ratio) particles was obtained by the method described in Example 1 of Japanese Patent No. 4306072. MFR of FEP dried and taken out was 15 g/10 min and a melting point was 228° C. The content of the surfactant was 5.5% with respect to FEP solid content weight. FEP particles contain carboxylic acid derived from an initiator in an end group, and the number of functional groups of the obtained functional group-containing FEP particles measured by the method described above was 207 groups per $10^6$ main-chain carbon atoms.

Preparation of FEP-2 Aqueous Dispersion

Using a polymerization initiator (di(ω-hydroperfluorohexanoyl)peroxide), TFE and HFP were subjected to suspension polymerization to produce FEP (TFE/HFP=85.7/14.3 mass ratio), and the obtained dry powder was crushed directly using an air jet mill apparatus (manufactured by I. M. MATERIAL Corporation), thereby to obtain a fine powder having an average particle size of 10 μm. With respect to 100 parts by mass of the obtained FEP fine powder, 10 parts by mass of an acetylene glycol-based dispersant (SURFYNOL 440, manufactured by Air Products Japan, K.K.), 10 parts by mass of a silicone-based surfactant (KP-106, manufactured by Shin-Etsu Chemical Co., Ltd.) and 280 parts by mass of deionized water were sufficiently stirred and mixed with the FEP fine powder, thereby to obtain an FEP dispersion. The number of functional groups of the obtained FEP particles measured by the method described above was 20 groups per $10^6$ main-chain carbon atoms.

PTFE Aqueous Dispersion

A PTFE aqueous dispersion used had a polymer solid content concentration of 64% by mass, a nonionic surfactant concentration of 2.7% by mass with respect to a polytetrafluoroethylene solid content, an average primary particle size of 312 nm, a standard specific gravity of 1.57, and the number of functional groups measured by the method described above of 10 or less per $10^6$ main-chain carbon atoms.

Preparation of PFA Aqueous Dispersion

An aqueous dispersion containing 20% of PFA (TFE/PPVE=96.6/3.4 mass ratio) particles was obtained by the method described in Example 4 of Japanese Patent No. 4306072. MFR of PFA dried and taken out was 22 g/10 min and a melting point was 315° C. The content of the surfactant was 2.9% with respect to PFA solid content weight. The number of functional groups of the obtained PFA particles measured by the method described above was 143 groups per $10^6$ main-chain carbon atoms.

Example 1

Coating Material Preparation

The obtained FEP-1 aqueous dispersion and the PTFE aqueous dispersion were mixed so that a solid content ratio of FEP:PTFE was 20:80, to which 14 parts by mass of a surfactant (NOIGEN TDS-80C), silica particles, and further 20 parts by mass of deionized water with respect to the solid contents of FEP and PTFE were added to prepare a coating material.

The silica particles used are as follows. B-1: ADMAFINE SC2500-SQ manufactured by ADMATECHS COMPANY LIMITED, average particle size 0.5 μm, specific surface area 6.1 $m^2$/g, sphere, specific gravity 2.2 $g/cm^3$ B-2: SILFIL manufactured by Tokuyama Corporation, average particle size 125 nm, specific surface area 30.0 $m^2$/g, sphere, specific gravity 2.2 $g/cm^3$ The average particle size of the fluororesins contained in the obtained coating composition was measured by the method described above. The results are shown in Table 2.

Examples 2 to 12

Coating materials were prepared in the same manner as in Example 1, except that each of the components contained was changed as shown in Tables 2 and 3.

Comparative Examples 1 to 5

Coating materials were prepared in the same manner as in Example 1, except that each of the components contained was changed as shown in Table 4.

Resin coating film layer was obtained in accordance with the following method.

The coating material was applied onto a copper foil (manufactured by FUKUDA METAL FOIL & POWDER CO., LTD. CF-V9S-SV-18, surface roughness 0.8 μm (Rz)) using a bar coater (No. 30). The copper foil after application was dried at 130° C. for 15 minutes. Further, the copper foil was sintered under nitrogen gas atmosphere at 350° C. for 15 minutes, thereby to produce a coating film having a film thickness of 10 μm.

Further, the obtained coating film was evaluated based on the following criteria.

Adhesive Force to Copper Foil

The adhesion strength was measured by superposing a laminate consisting of the coating film layer and the substrate so that the coating film layer adheres firmly to a copper foil, pressing for 5 minutes at a heating temperature: 320° C. and a pressure: 3 MPa, thereby obtaining a bonded body on which the laminate consisting of the coating film layer and the substrate and the copper foil were laminated, and then cutting the bonded body to strip shape of width 10 mm×length 40 mm×3 sets to prepare test pieces, subjecting these test pieces to a peel test using an autograph (manufactured by SHIMADZU CORPORATION, AGS-J 5 kN) in conformity with JIS C 6481-1996, at 25° C. and a tensile speed of 50 ram/min, and observing a delamination mode.

Poor: Adhesion strength was less than 5 N/cm.
Fair: Adhesion strength was 5 N/cm or more.
Good: Adhesion strength was 7 N/cm or more.

Heat Resistance Test

A laminate consisting of the coating film layer and the substrate was superposed so that the coating film layer adhered firmly to the copper foil, pressed for 5 minutes at a heating temperature under vacuum: 320° C. and a pressure: 3 MPa, thereby obtaining a bonded body on which the laminate consisting of the coating film layer and the substrate and the copper foil were laminated. Then, the bonded body, on which a pattern was created by etching, was floated in a molten solder bath at 288° C. for 10 seconds. The bonded body, after removal from the solder bath, was visually confirmed for delamination of the coating film layer and presence/absence of blisters.

Poor: Delaminated with blisters
Fair: No delamination with slight blisters
Good: No delamination or blisters Aggregation of Silica The application surface was observed using SEM to confirm presence/absence of aggregation of silica particles.
Poor: Aggregated
Good: Not aggregated Coating Film Defect The application surface was visually observed to confirm conditions of coating film defects.
Poor: Present
Good: Absent Coefficient of Linear Expansion A laminate consisting of the coating film layer and the substrate was superposed so that the coating film layer adhered firmly to the copper foil, pressed for 5 minutes at a heating temperature under vacuum: 320° C. and a pressure: 3 MPa, thereby obtaining a bonded body on which the laminate consisting of the coating film layer and the substrate and the copper foil were laminated. Then, the substrate was removed by etching, and the obtained coating film was measured for a coefficient of linear expansion with a load of 5 g using TMA manufactured by Hitachi High-Tech Science Corporation.

Poor: 160 ppm or more
Good: Less than 160 ppm

TABLE 2

|  |  | Example 1 | Example 2 | Example 3 | Example 4 | Example 5 | Example 6 | Example 7 | Example 8 |
|---|---|---|---|---|---|---|---|---|---|
| Fluororesins ratio | PTFE | 80 | 80 | 65 | 65 | 60 | 60 | 40 | 40 |
|  | PFA | 0 | 0 | 0 | 0 | 0 | 0 | 0 | 0 |
|  | FEP-1 | 20 | 20 | 35 | 35 | 40 | 40 | 60 | 60 |
|  | FEP-2 | 0 | 0 | 0 | 0 | 0 | 0 | 0 | 0 |
| Fluororesin:Silica |  | 60:40 | 50:50 | 60:40 | 50:50 | 60:40 | 50:50 | 60:40 | 50:50 |
| Specific surface area of silica |  | 6.1 | 6.1 | 6.1 | 6.1 | 6.1 | 6.1 | 6.1 | 6.1 |
| Average particle size of fluororesins (μm) |  | 0.26 | 0.26 | 0.20 | 0.20 | 0.21 | 0.21 | 0.18 | 0.18 |
| Adhesive force against copper foil |  | Good | Good | Good | Good | Good | Good | Good | Good |
| Heat resistance test result |  | Good | Good | Good | Good | Good | Good | Good | Good |
| Silica aggregation |  | Good | Good | Good | Good | Good | Good | Good | Good |
| Coating film defect |  | Good | Good | Good | Good | Good | Good | Good | Good |
| Coefficient of linear expansion |  | Good | Good | Good | Good | Good | Good | Good | Good |

TABLE 3

|  |  | Example 9 | Example 10 | Example 11 | Example 12 |
|---|---|---|---|---|---|
| Fluororesins ratio | PTFE | 95 | 5 | 60 | 0 |
|  | PFA | 0 | 0 | 0 | 65 |
|  | FEP-1 | 5 | 95 | 40 | 35 |
|  | FEP-2 | 0 | 0 | 0 | 0 |
| Fluororesin:Silica |  | 50:50 | 50:50 | 60:40 | 60:40 |
| Specific surface area of silica |  | 6.1 | 6.1 | 30.0 | 6.1 |
| Average particle size of fluororesins (μm) |  | 0.25 | 0.15 | 0.21 | 0.13 |
| Adhesive force against copper foil |  | Fair | Good | Good | Good |
| Heat resistance test result |  | Good | Fair | Good | Good |
| Silica aggregation |  | Good | Good | Poor | Good |
| Coating film defect |  | Good | Good | Good | Good |
| Coefficient of linear expansion |  | Good | Good | Good | Good |

TABLE 4

| | | Comparative Example 1 | Comparative Example 2 | Comparative Example 3 | Comparative Example 4 | Comparative Example 5 |
|---|---|---|---|---|---|---|
| Fluororesins ratio | PTFE | 100 | 0 | 100 | 0 | 60 |
| | PFA | 0 | 0 | 0 | 0 | 0 |
| | FEP-1 | 0 | 100 | 0 | 100 | 0 |
| | FEP-2 | 0 | 0 | 0 | 0 | 40 |
| Fluororesin:Silica | | 60:40 | 60:40 | 100:0 | 100:0 | 60:40 |
| Specific surface area of silica | | 6.1 | 6.1 | — | — | 6.1 |
| Average particle size of fluororesins (μm) | | 0.27 | 0.10 | 0.27 | 0.10 | 6.3 |
| Adhesive force against copper foil | | Poor | Good | Poor | Good | Poor |
| Heat resistance test result | | Good | Poor | Good | Poor | Good |
| Silica aggregation | | Good | Good | — | — | Good |
| Coating film defect | | Poor | Poor | Good | Poor | Poor |
| Coefficient of linear expansion | | Good | Good | Poor | Poor | Good |

The examples showed that the coating film layers obtained by the coating composition of the present disclosure have excellent adhesive properties to the copper foil substrate and high heat resistance.

INDUSTRIAL APPLICABILITY

The present disclosure can provide the coating composition capable of forming a coating film layer having good adhesive properties to a metal substrate, and excellent electrical properties and surface physical properties. The coating composition is preferably used for the application of printed circuit boards, dielectric materials for circuit boards, laminated circuit boards, and the like.

The invention claimed is:

1. A coating composition comprising 2 or more kinds of fluororesins,
   wherein at least 1 kind of the fluororesin, a fluororesin (I), has a number of functional groups of 30 to 1,000 per $10^6$ main-chain carbon atoms,
   wherein the coating composition further comprises an inorganic filler, a surfactant, and a medium,
   wherein the fluororesin (I) is a tetrafluoroethylene-hexafluoropropylene copolymer (FEP) or a tetrafluoroethylene-perfluoroalkyl vinyl ether copolymer (PFA).

2. The coating composition according to claim 1, wherein the functional group contained in the fluororesin (I) is a carbonyl group-containing group.

3. The coating composition according to claim 2, wherein the carbonyl group-containing group is at least 1 group selected from the group consisting of a carbonyl amide group, a carboxy group, an acyl fluoride group, and a methoxycarbonyl group.

4. The coating composition according to claim 1, wherein the functional group contained in the fluororesin (I) is present at an end of the polymer main chain.

5. The coating composition according to claim 1, further comprising, as another fluororesin, a fluororesin (II) having the number of functional groups of less than 30 per $10^6$ main-chain carbon atoms.

6. The coating composition according to claim 1, wherein an average particle size of the fluororesins is less than 0.3 μm.

7. The coating composition according to claim 1, wherein at least 1 kind of the fluororesin is PTFE.

8. The coating composition according to claim 1, wherein the inorganic filler is a silica particle.

9. The coating composition according to claim 8, wherein the silica particle has a specific surface area of less than 6.5 $m^2/g$.

10. The coating composition according to claim 1, wherein the surfactant is a non-fluorosurfactant.

11. The coating composition according to claim 1, wherein the liquid medium contains water.

12. A laminate having a film layer formed by applying the coating composition according to claim 1 onto a substrate.

13. The laminate according to claim 12, wherein the substrate is a metal material.

14. The laminate according to claim 12, which is a printed circuit board, a dielectric material for a circuit board, or a laminated circuit board.

* * * * *